United States Patent [19]

Harris et al.

[11] 3,798,762

[45] Mar. 26, 1974

[54] CIRCUIT BOARD PROCESSING

[75] Inventors: Norman H. Harris, Saugus; John H. Thomas, Huntington Beach; Harlan R. Isaak, Costa Mesa; John W. Kanz, Miraleste, all of Calif.

[73] Assignee: The United States of America as represented by the Secretary of the Army, Washington, D.C.

[22] Filed: Aug. 14, 1972

[21] Appl. No.: 280,314

[52] U.S. Cl. .................... 29/626, 29/625, 174/68.5, 264/61, 264/63, 264/109

[51] Int. Cl. ........ H05k 3/30, H05k 3/12, H05k 3/28

[58] Field of Search ............ 29/624, 625, 628, 626; 156/89; 117/212; 174/68.5; 264/61, 63, 66, 109; 106/39.5, 46, 48

[56] References Cited

UNITED STATES PATENTS

| | | | |
|---|---|---|---|
| 3,085,899 | 4/1963 | Forman | 174/68.5 UX |
| 3,189,978 | 6/1965 | Stetson | 29/625 |
| 3,294,951 | 12/1966 | Olson | 29/626 X |
| 3,317,653 | 5/1967 | Layer et al. | 174/68.5 |

*Primary Examiner*—Charles W. Lanham
*Assistant Examiner*—Joseph A. Walkowski
*Attorney, Agent, or Firm*—Lawrence A. Neureither; Leonard Flank; James T. Deaton

[57] ABSTRACT

A method of making a multilayer printed circuit board and subsequent mounting of the printed circuit board to a carrier without compromising the electric properties and optimizing the mechanical characteristics of the assembly.

8 Claims, 4 Drawing Figures

PATENTED MAR 26 1974 3,798,762

CIRCUIT BOARD PROCESSING

CROSS REFERENCE TO RELATED APPLICATION

This application is related to co-pending application Ser. No. 262,840, filed June 14, 1972, and application Ser. No. 279,142 filed Aug. 9, 1972.

BACKGROUND OF THE INVENTION

Recent sophisticated aerospace vehicles require advanced electronic packaging design in order to meet the stringent space and weight requirement imposed on the electronic systems. Thick-film assemblies using screen printed multilayer interconnection boards are needed to meet these requirements.

Accordingly, it is an object of this invention to provide a method by which multilayer printed circuit boards that are light in weight and reliable can be fabricated.

Another object of this invention is to provide a multilayer circuit board that can be made by a method of screen printing.

A further object of this invention is to provide a method by which large area multilayer printed circuit boards can be fabricated.

SUMMARY OF THE INVENTION

In accordance with this invention, a method of fabricating a multilayer printed circuit board is disclosed in which a straight and flat substrate such as alumina has a circuit printed thereon by screen printing and using a gold type ink paste. The ink paste is allowed to dry and is then fired in an oven for a predetermined period of time at a predetermined temperature. After firing the printed circuit, a dielectric paste is double printed over the printed circuit and allowed to dry. Over the double layer of printed dielectric, another printed circuit is printed and allowed to dry. The dielectric and second printed circuit are then fired in an oven at a predetermined temperature for a predetermined length of time to set the dielectric and the second printed circuit. The desired multiple layers of printed circuits are built up with alternate layers of dielectric and printed circuits until the desired number has been obtained. The multilayer printed circuit is then dip coated in ordinary lead-tin eutectic solder and finally bonded to a molybdenum plate which provides mechanical support for system mounting. The molybdenum plate acts as a heat sink and is also ideal since the thermal coefficient of expansion of molybdenum is close enough to that of the aluminium substrate to prevent warpage problems during temperature cycling in subsequent processing such as solder reflow or in system usage. The assembly is bonded to the molybdenum plate using silicone adhesive that has good thermal transfer properties. The silicone adhesive is generally screen printed to maintain thickness control and the assembly and molybdenum plate are mated and held in place by vacuum bagging until the silicone adhesive has cured. Other components are then connected to the top conductor of the multilayer structure.

DESCRIPTION OF THE PREFERRED EMBODIMENT

Figure 1:
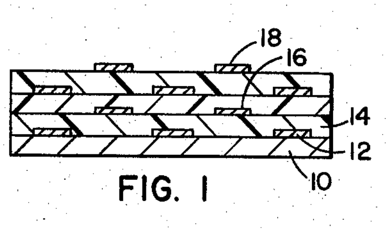
FIG. 1 is a schematic sectional representation on an enlarged scale of a multilayer structure according to this invention.

Referring now to FIG. 1, flat alumina (i.e. $Al_2O_3$) substrate 10 is first cleaned and then annealed in a flattening process by placing the substrate between two flat members and heating to a predetermined temperature of about 2,580° F as more specifically disclosed in co-pending application Ser. No. 279,142, filed Aug. 9, 1972. Gold conductor 12 is screen printed on substrate 10 and allowed to dry. The substrate and Gold conductor are then fired in an oven at a temperature between about 850 to about 930° C for a period of time of about 8 minutes. Next, two layers of silicone adhesive type dielectric material 14 is printed over first circuit 12 and allowed to dry. A second printed circuit 16 is then printed on top of dielectric 14 and allowed to dry. After drying of conductor 16, dielectric 14 and conductor 16 are fired in the same manner as conductor 12 was fired. This sequence of alternate layers of conductor and dielectric is repeated until the desired number of layers has been printed and fired. Outer conductor layer 18 is preferably printed from platinum-gold conductor adhesive ink type material since this material is found to solder more readily than the gold conductor.

Figure 2:
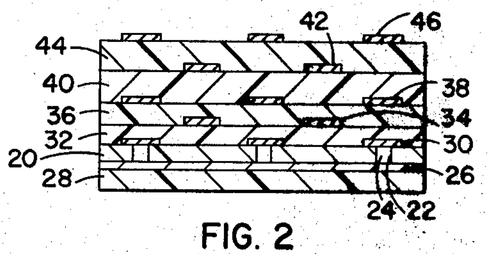
FIG. 2 is a schematic sectional view on an enlarged scale of another embodiment according to this invention.

Referring to FIG. 2, another embodiment is disclosed that has an alumina substrate 20 that has through holes 22 with gold conductor 24 mounted therein by pressing the gold paste like conductor into the through holes as more particularly disclosed in co-pending application Ser. No. 262,840. After the gold conductors 24 are pressed into substrate 20, the gold conductors and substrate are fired at a temperature between 850 and 930° C for time of about 8 minutes. The ground plane conductor 26 is then printed on the bottom side of substrate 20 and again fired at the temperature and times previously specified. The dielectric layers 28 are then printed and fired in accordance with the firing time and temperature for the ground plane and through conductors. The top conductor 30 is then screen printed to make contact with through conductors 24 and ground plane 26. The top conductor 30 is then fired in the same manner as the other conductors were fired. Layers of dielectric 32 are then printed over conductor 30 and allowed to dry before conductor 34 is screen printed over dielectric 32. The dielectric 32 and conductor 34 are then fired in the same manner and for the same length of time as conductor 24 and ground plane 26. Alternate layers of dielectrics 36, 40 and 44 and alternate conductors 38, 42 and 46 are printed and fired in the same manner as that of conductors 30 and 34 and dielectric 32 until the desired number of circuits are obtained. The top conductor 46 or the last conductor on the stack should be printed from a platinum-gold type printing adhesive since this material accepts soldering better than the gold conductor.

Various combinations of dielectric-conductor layers can be used. To aid in the discussion that follows, the shorthand notation is used: C = conductor print and dry, D = dielectric print and dry, V = via fill and dry, and F = fire. For example C-F-D-D-C-F means the first conductor is printed, dried, and fired. A double printing of dielectric with drying between prints follows. And finally, the second conductor is printed, dried, and co-fired with the dielectric. It has been found that a minimum of two dielectric prints between conductors is necessary to prevent shorts. Also, the combination C-F-D-D-C-F is superior with respect to shorting than is the C-F-D-D-F-C-F combination, although the latter has less tendency to produce fissures at the platinum-gold conductor-dielectric boundary. Since shrinkage factors and thermal coefficient of expansion between conductors and dielectrics differ, firing after each conductor or dielectric printing preshrinks the material causing less stress and fissuring than co-firing. Extra firing does not appear to effect dielectric properties, but does change the color of the dielectric to a deeper yellow.

In order to allow a C-F-D-D-F-C-F type sequence with its superior mechanical structure and eliminate the shorts, additional dielectric layers are added. As the dielectric thickness increases, deeper via's, which are used to interconnect different layers of the printed circuit, no longer fill with conductors upon printing. Therefore, an intermediate via filling step by screen printing is necessary. The resulting sequence C-F-D-D-V-F-D-D-V-F-C-F is used to produce multilayers with no shorts and an excellent mechanical structure. The via's are purposely placed in the dielectric material when screen printing in order to have interconnections between the different layers of printed circuits as desired. That is, for example the first and second printed circuits are interconnected by ink filling the via between the first and second conductors. This unique feature of screen printing the via's in the dielectric allows multilayer structures of this type to become practical and possible even with large area printed circuits.

As the number of conductor layers increases to five in multilayer structure (a ground plane, power layer, and three signal layers), the warpage due to the mismatch and thermal expansion becomes large. A solid sheet of gold conductor on the substrate produces a concave warpage where as a solid sheet of dielectric produces a convex warpage. From this it is inferred that the conductor has a thermal coefficient of expansion greater than the substrate and the dielectric has a thermal coefficient of expansion less than the substrate. Thick multilayer structures of 25 mils of conductor and dielectric on a 25-mil substrate have been produced. To decrease warpage and signal capacitance to ground, the ground plane is moved to the back side of the substrate as illustrated in FIG. 2. This necessitates feed-through holes in the substrate to make connection to the ground plane. Feed-though holes are filled with gold conductor paste and fired to form solid gold plugs in the feed-through holes. Gold conductor pads are then screened and fired over the feed-through holes on the side opposite the ground plane to provide connection points. The fill material in feed-through holes is reasonably dense and makes good connections with the ground plane and conductor pad of the printed circuit.

Figure 4:
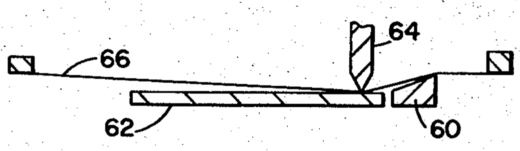
FIG. 4 is a schematic illustration of a screen printer used in this invention.

The conductors and dielectrics are printed with a Presco Screen Printer using 200-mesh 8 by 10 inch screens. The first concern in printing a large substrate is: can a reasonable print be made with such a small screen to substrate size ratio? It has been found that a good conductor print can be made, but the dielectric material presents more of a problem. As the substrate-to-screen gap is increased, the pattern edge does not always print properly. Decreasing the substrate-to-screen gap to produce complete edge printing usually results in poor screen breakaway. The surface of the dielectric is wavy in some areas with a tendency to form pinholes along the previously deposited conductor. As the squeegee of the screen printer moves across the substrate, the deposited ink paste acts like a glue holding the screen to the substrate, particularly during the latter half of the squeegee stroke. The screen is slowly released many seconds after the squeegee completes it stroke, resulting in a wavy horseshoe-shaped pattern on an otherwise good print. To combat this problem, a ramp is used at the end of the substrate. See FIG. 4 which shows a schematic diagram of ramp 60 in relation to substrate 62. As squeegee 64 moves across screen 66, the squeegee increases screen tension behind the squeegee in the direction of the squeegee travel. As the squeegee approaches the ramp, the ramp begins to interact with the screen, which further increases the tension which in turn aids screen breakaway. As the squeegee travels up the ramp, any part of the screen left sticking in the deposited dielectric is immediately pulled out. By adjusting the ramp, smooth pinhole-free dielectric deposits are obtained.

Line widths and spaces in the screens of 20 mils and via's of 20-mil diameter have been found to be most practical. Print uniformity across the substrate is usually good but depends upon the flatness of the alumina substrate.

Electro Science Labs (ESL) materials are used for the multilayer fabrication. ESL 8831 gold is used for the innerconductors because of its excellent conductivity which ranges from 0.002 to 0.004 ohm per square. The rheology of the paste allows prints with very good edge definition. The paste has a shrinkage factor upon firing of approximately 50 percent which results in fired films with a low profile of approximately 0.5 mil when printed with a 200-mesh screen. This low profile reduces interference of the conductor with the subsequent dielectric printing. ESL 5800C platinum-gold is used for the top conductor for its solderability. Conductivity for the ESL 5800C paste ranges from 0.080 to 0.100 ohm per square for an unsoldered film when printed with a 200-mesh screen and approximately 0.010 ohm per square for a soldered film. ESL 4610 and 4608 dielectric adhesive or paste are used for the insulating layers. The dielectric constants are 10 and 8 respectively. Platinum-gold conductors have been found to solder more readily on ESL 4610 than on 4608; however, the shrinkage and lower coefficient of expansion of the ESL 4610 causes a fissuring or delamination at the conductor and dielectric boundary when thicker conductors are involved. This fissuring is less severe when ESL 4608 is used. The gold conductor-dielectric boundary causes considerably less of a fissuring problem. Other conductor and dielectric paste can be used to obtain similar results. Substrates that are 96 percent alumina and are the size of 4 by 6 by 0.025 inches work well with multilayer structures of the type disclosed herein. Substrates with a wavy type of warpage cannot be held down and must be flattened by annealing at approximately 1,400° C with a very slow cooldown as more specifically disclosed in co-pending application Ser. No. 279,142 filed Aug. 9, 1972. Once the substrates are annealed, very little problem is encountered due to warpage.

After the multilayer structure is fabricated with the various layers of conductor and dielectric, the structure is emersed in a 1—1 mixture of peanut oil and non-activated flux maintained at 135° C and then emersed in molten solder. The solder used for this dipping operation is ordinary lead-tin eutectic solder that is held at a temperature below 232° C. The structure is dipped twice in order to obtain a sufficient coating of solder on the platinum-gold conductor. The few localized areas of the platinum-gold conductor that occasionally do not wet may be touched up with a small temperature controlled iron.

Figure 3:
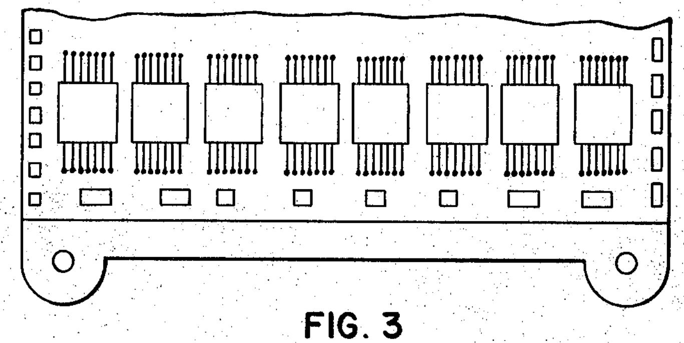
FIG. 3 is a top view illustrating the multilayer structure mounted on a molybdenum plate.

The multilayer structure is then bonded with silicone adhesive to a molybdenum plate which provides mechanical support for system mounting and also acts as a heat sink (see FIG. 3). Molybdenum is chosen because its thermal coefficient of expansion is close to that of the alumina substrate to prevent warpage problems during temperature cycling and subsequent processing such as solder reflow or in system usage. Bonding of these two structures is straightforward and is bonded by screen printing silicone adhesive on the structures to maintain thickness control and then the two parts are mated and held in place by vacuum bagging until the heat adhesive has cured. Once this step is complete, components such as flat packs, chip resistors and capacitors, and small hybrid thick-film subassemblies are mounted on the multilayer with the same screened silicone adhesive as used in the dielectric layers. The silicone adhesive is then cured and solder reflow is used to complete the electrical connections of the various attached components. Flexible wire harnesses are then hand-soldered to contact pads along each edge of the multilayer as needed. Built-in strain relief prevents inadvertent damage to these pads from excessive cable flexure.

In screen printing of the conductor and dielectric layers, any imperfections are touched up by hand and allowed to dry. Generally, touch-up of the dielectric material and conductor material is done prior to firing.

The table below illustrates steps that are generally followed in fabricating multilayer structures according to this invention. Depending upon the particular structure desired, various steps can be omitted or other stpes inserted in order to fabricate the structure particularly desired.

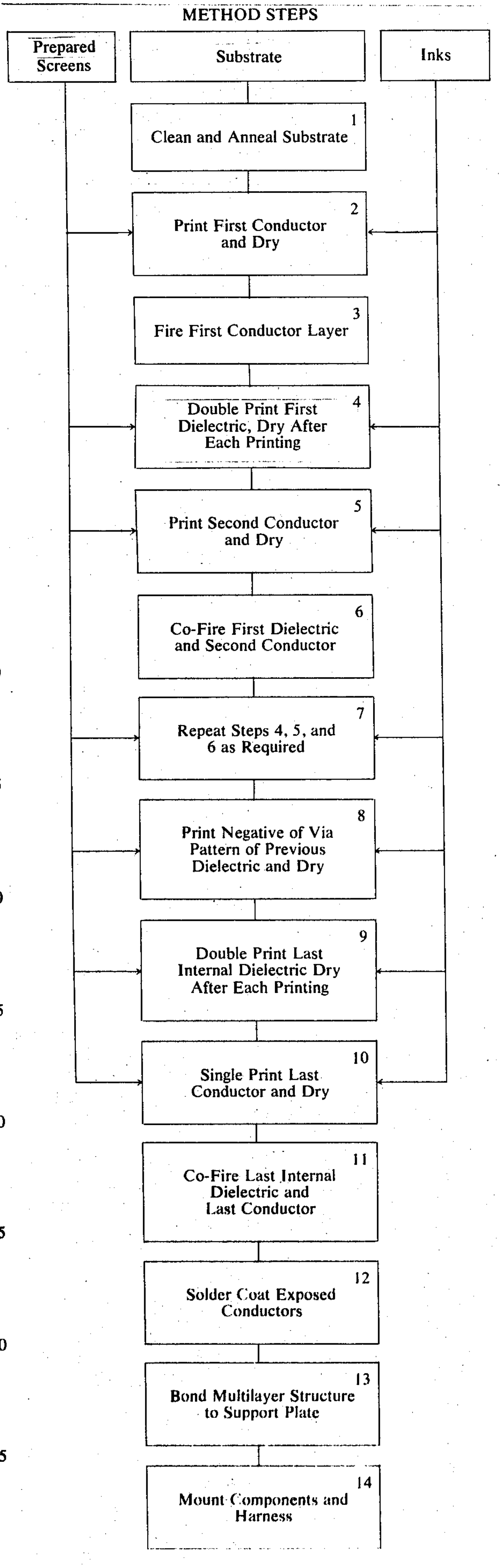

We claim:

1. A method of making a large area multilayer printed circuit structure comprising:

a. providing a straight and flat substrate material, b. screen printing a first conductor circuit on said substrate and allowing said first conductor to dry, c. firing said first conductor layer, d. screen printing a double layer of dielectric material over said first conductor and allowing said dielectric to dry after each printing of said dielectric, e. printing a second conductor circuit over said first dielectric and said first conductor and allowing said second conductor to dry, f. co-firing said first dielectric and second conductor, g. repeating steps d, e, and f until the desired number of conductor-dielectric layers have been printed, and h. solder coating the last and exposed conductor.

2. A method of making a multilayer structure as set forth in claim 1, wherein said substrate is alumina, wherein said last printed conductor is platinum-gold and wherein the other of said printed conductors are gold.

3. A method of making a multilayer structure as set forth in claim 1, wherein said substrate has holes therethrough, and said method comprising filling said holes with a gold conductor and allowing to dry, firing said gold conductor that fills said holes, screen printing a ground plane conductor on a bottom side of said substrate and allowing said ground plane to dry, firing said ground plane, screen printing a double layer of dielectric material over said ground plane and allowing each layer of said dielectric to dry, and firing said double layer of dielectric.

4. A method of making a multilayer structure as set forth in claim 1, wherein said repeated steps of screen printing the dielectric involves first printing two layers of dielectric with via's therein, screen printing the via's with conductor material, and then screen printing layers of dielectric before screen printing of the printed circuit conductor layer.

5. The method of fabricating a multilayer structure as set forth in claim 1, where said substrate is alumina and is annealed at a temperature of approximately 1,400° C.

6. The method of fabricating a multilayer structure as set forth in claim 1, said method further comprising bonding said substrate to a molybdenum support plate.

7. The method of fabricating a multilayer structure as set forth in claim 1, wherein components are bonded to the top surface of the multilayer structure and then interconnected to the exposed conductor.

8. A method of making a multilayer structure as set forth in claim 1, wherein said screen printing is done using a screen printer that has a ramp at the end of the substrate to cause the screen to breakaway as the squeegee of the screen printer travels up the ramp.

* * * * *